United States Patent
Morohashi et al.

(10) Patent No.: US 7,015,758 B2
(45) Date of Patent: Mar. 21, 2006

(54) GAIN CONTROL CIRCUIT, AND A RADIO COMMUNICATION APPARATUS USING THE SAME

(75) Inventors: Hideo Morohashi, Kanagawa (JP); Shinichi Tanabe, Kanagawa (JP)

(73) Assignee: Sony Corporation, (JP)

( * ) Notice: Subject to any disclaimer, the term of this patent is extended or adjusted under 35 U.S.C. 154(b) by 0 days.

(21) Appl. No.: 11/066,438

(22) Filed: Feb. 28, 2005

(65) Prior Publication Data

US 2005/0170804 A1 Aug. 4, 2005

Related U.S. Application Data

(63) Continuation of application No. 09/759,213, filed on Jan. 16, 2001, now Pat. No. 6,876,257.

(30) Foreign Application Priority Data

Jan. 17, 2000 (JP) .......................... P2000-007359

(51) Int. Cl.
*H04B 7/00* (2006.01)
*H04B 1/06* (2006.01)

(52) U.S. Cl. ................. 330/278; 455/127.2; 455/232.1; 455/239.1; 330/254; 330/279

(58) Field of Classification Search .......... 455/127.2, 455/232.1, 239.1, 240.1; 330/278–279, 129, 330/254
See application file for complete search history.

(56) References Cited

U.S. PATENT DOCUMENTS

| | | | |
|---|---|---|---|
| 5,146,130 A | | 9/1992 | Kawakatsu |
| 5,146,180 A | * | 9/1992 | Hyakutake ................... 330/254 |
| 5,606,284 A | | 2/1997 | Tamesue et al. |
| 5,862,460 A | * | 1/1999 | Rich ........................... 455/116 |
| 5,900,782 A | * | 5/1999 | Igarashi et al. ............. 330/254 |
| 5,933,771 A | | 8/1999 | Tiller et al. |
| 6,127,890 A | * | 10/2000 | Shimomura et al. ........ 330/254 |
| 6,215,989 B1 | * | 4/2001 | Otaka ...................... 455/234.1 |
| 6,259,682 B1 | | 7/2001 | Brown et al. |
| 6,553,084 B1 | | 4/2003 | Maru |
| 6,876,257 B1 | * | 4/2005 | Morohashi et al. .......... 330/278 |

* cited by examiner

*Primary Examiner*—Simon Nguyen
(74) *Attorney, Agent, or Firm*—Rader, Fishman & Grauer PLLC; Ronald P. Kananen

(57) ABSTRACT

A gain control circuit comprises a variable gain circuit having a predetermined gain control range and a control voltage supply circuit for supplying an internal control voltage to the variable gain circuit as a gain control signal. In this gain control circuit, the control voltage supply circuit generates the internal control voltage in response to an external control voltage so as to compensate the linearity of the variable gain circuit to the extent of the external control voltage where the variable gain circuit loses linearity. This gain control circuit is applied to an AGC circuit of the transmitting stage in a CDMA-type mobile phone.

5 Claims, 7 Drawing Sheets

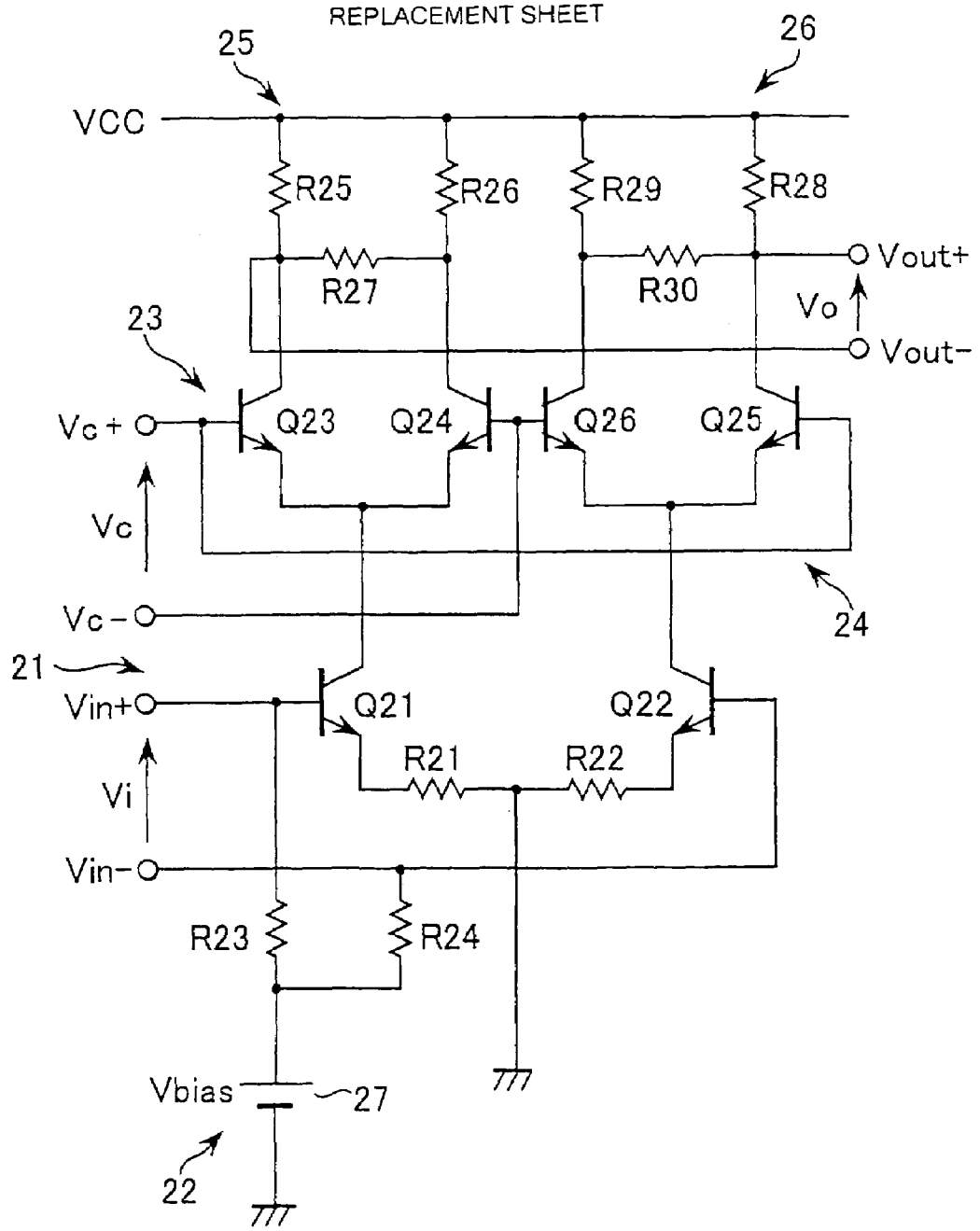
FIG.2
REPLACEMENT SHEET

GAIN CONTROL CIRCUIT, AND A RADIO COMMUNICATION APPARATUS USING THE SAME

This is a continuation application of Ser. No. 09/759,213, filed on Jan. 16, 2001, now U.S Pat. No. 6,876,257 the entire contents of which are hereby incorporated by reference.

BACKGROUND OF THE INVENTION

1. Field of the Invention

The present invention relates to a gain control circuit and a radio communication apparatus using such gain control circuit, and more particularly the present invention relates to a gain control circuit to be used for an output power control in a mobile radio communication apparatus and to a radio communication system using such mobile radio communication apparatus.

2. Description of the Related Art

In a mobile radio communication system, for example, in a mobile telephone system, it is desirable that the output power of each mobile terminal is controlled so as to be received with the same signal strength at a base station, in order to increase the communication capacity of the base station.

In particular, in a communication system in which the mobile telephone system employs a spectrum scattering method referred to as a CDMA (Code Division Multiple Access) system, plural stations are assigned to the same frequency band, and a received signal is recovered by means of a predetermined scattering code. And accordingly, output power control of each mobile terminal becomes a necessary requirement.

There are two types of power control systems that perform the output power control of the mobile terminal. One of the two types of systems is to determine the output power of the mobile terminal in accordance with the signal strength of a received signal by the mobile terminal, wherein the signal is transmitted from the base station. This type depends on the hypothesis that there is a strong correlation between the signal propagation from the base station to the mobile terminal and the signal propagation from the mobile terminal to the base station. This type of control is named an open loop control.

The other type of system is to determine for information about an actually received the strength of the radio wave at the base station, wherein such information is transmitted from the base station to the mobile terminal. This type of control is named a closed-loop control.

A gain control circuit is necessary in order to control the output power.

The performance of such gain control circuit requires a wide gain control range, a wide dynamic range, a good controllable linearity, an absolute gain accuracy, a good temperature characteristic and a broad frequency band.

For example, as the gain control range, a gain of about 90 dB is necessary in a receiving side, and a gain of about 80 dB is necessary in a transmitting side. As for the dynamic range, it is necessary to consider, particularly in the receiving side, a situation where the radio signal wave received is very weak and a strong interfering radio wave enters. And accordingly, as for the gain control circuit, tolerance to a very large input signal and a low noise characteristic are simultaneously required.

It is necessary to match the characteristic of the receiving side gain control circuit and the transmitting side gain control circuit about the controllable linearity, the absolute gain accuracy, the temperature characteristic in order to raise the accuracy of the previously described the open loop control. About the frequency bandwidth, it is different by a system, but it is easiest to do such an operation by an IF (Intermediate Frequency) stage. As for the typical frequency of that purpose, there are many cases that are around 100 MHz.

FIG. 6 is a circuit diagram which shows a conventional embodiment of a variable gain circuit constituting a gain control circuit. The variable gain circuit of this conventional embodiment has a differential amplifying circuit 101, a bias circuit 102, a pair of current dividing circuits 103 and 104 and a pair of resistive circuit meshes 105 and 106.

The differential amplifying circuit 101 comprises npn-type differential pair transistors Q101 and Q102, in which each emitter electrode of the transistors Q101 and Q102 is grounded through respective emitter resistors R101 and R102, respectively. An input voltage Vi is supplied to input terminals Vin+, Vin− connected to each base electrode of the differential pair transistors Q101 and Q102.

The bias circuit 102 comprises bias resistors R103 and R104 connected to each base electrode of the differential pair transistors Q101 and Q102 and a bias voltage supply 107 connected between the bias resistors R103 and R104 and the ground and which supplies a fixed bias voltage Vbias to each base electrode of the differential pair transistors Q101 and Q102 through the bias resistors R103 and R104.

One current dividing circuit 103 comprises npn-type differential pair transistors Q103 and Q104, in which each emitter electrode of the transistors Q103 and Q104 is connected commonly to a collector electrode of the transistor Q101. The other current dividing circuit 104 comprises npn-type differential pair transistors Q105 and Q106, in which each emitter electrode of the transistors Q105 and Q106 is connected commonly to a collector electrode of the transistor Q102.

In these current dividing circuits 103 and 104, each base electrode of transistors Q103 and Q105 is connected to each other, each base electrode of transistors Q104 and Q106 is connected to each other and a control voltage Vc is applied to a pair of input terminals Vc+, Vc− connected between these base electrodes of the transistors Q103, Q105, Q104 and Q106. And, an output voltage Vo is provided from a pair of output terminals Vout+, Vout− connected to each collector electrode of the transistors Q103 and Q105.

One resistive circuit mesh 105 comprises resistors R105 and R106 connected between the differential pair transistors Q103, Q104 and a power source voltage VCC and a resistor R107 connected to the collector electrodes of the differential pair transistor Q103 and Q104. The other resistive circuit mesh 106 comprises resistors R108 and R109 connected between the differential pair transistors Q105, Q106 and the power source voltage VCC and a resistor R110 connected to the collector electrodes of the differential pair transistor Q105 and Q106.

The transmission gain G of the variable gain circuit, as shown in FIG. 6, is now explained. At first, the control voltage Vc from the control voltage supply circuit 108 is supplied to the input terminals Vc+, Vc− connected between the base electrodes of the differential pair transistors Q103 and Q104 and the base electrodes of the differential pair transistors Q105 and Q106. This control voltage supply circuit 108 generates an internal control voltage Vc varying in linearity relative to the external control voltage VC supplied from an external control voltage generating source 109.

The transmission gain G varies by changing the ratio of flowing currents of the current dividing circuits 103 and 104 in accordance with the internal-control voltage Vc generated at the control voltage supply circuit 108 based on the external control voltage VC from the external control voltage generating source 109, wherein the potential difference ΔVbe between base electrodes of the differential pair transistors Q103 and Q104 and the differential pair transistors Q105 and Q106 are changed by means of the internal control voltage Vc supplied from the control voltage supply circuit 108.

The transmission gain G is expressed by the next expression:

$$G=Gmax/\{1+\exp(-qVc/kt)\}+Gmim/\{1+\exp(qVc/kt)\}$$

Gmax shows the maximum transmission gain of the variable gain circuit, Gmin shows the minimum transmission gain of the variable gain circuit, q shows the charge of an electron, k shows the Boltzmann's constant and t shows the absolute temperature.

As described above, in the conventional variable gain circuit, the transmission gain G is controlled by means of the internal control voltage Vc that varies in linearity relative to the external control voltage VC. As shown in FIG. 7, as the external control voltage VC approaches the maximum transmission gain Gmax or the minimum transmission gain Gmin, the characteristic curve tends to bend, and the linearity of the variable gain circuit becomes deteriorated.

This kind of variable gain circuit composes a gain control circuit by providing a plural number of the variable gain circuits in a cascade connection by way of buffer circuits. For example, this kind of gain control circuit is used as an AGC (Automatic Gain Control) amplifier for amplifying an IF (Intermediate Frequency) signal of a transmission stage in an RF (Radio Frequency) front-end section of the CDMA-type mobile telephone apparatus.

In such an application, a multistage-type variable gain circuit, such as mentioned above, is used as the AGC amplifier in order to satisfy a request for a wide variable gain range, but if the linearity of the gain control characteristic is bad, it is necessary to increase the number of stages of the variable gain circuit to be cascade-connected thereto. As a result, the circuit scale of the AGC amplifier becomes large and current consumption increases too.

SUMMARY OF THE INVENTION

A primary object of the invention is to provide a gain control circuit having a more controllable linear characteristic relative to the external control voltage and a radio communication apparatus using such gain control circuit.

The gain control circuit of the present invention comprises a variable gain circuit having a predetermined gain control range and a control voltage supply circuit for supplying an internal control voltage to the variable gain circuit as a gain control signal, wherein the control voltage supply circuit generates the internal control voltage in response to an external control voltage as to compensate the linearity of the variable gain circuit to the extent of the external control voltage where the variable gain circuit loses linearity. And, this gain control circuit can be used at an IF signal amplifying stage of a radio communication apparatus, such as a mobile telephone apparatus, as an amplification means.

Namely, in a radio communication apparatus having an amplification means in a transmitting stage for amplifying an intermediate frequency signal and supplying the intermediate frequency signal to a mixing circuit, according to another aspect of the present invention, the amplification means comprises a variable gain circuit having a predetermined gain control range and a control voltage supply circuit for supplying an internal control voltage to the variable gain circuit as a gain control signal, wherein the control voltage supply circuit generates the internal control voltage in response to an external control voltage so as to compensate the linearity of the variable gain circuit to the extent of the external control voltage where the variable gain circuit loses linearity.

Compensation of the non-linearity is done in a range where the linearity of gain control characteristic is lost. As a result, the linear range of the variable gain circuit can be expanded, so that the linearity extends to the range where linearity is conventionally lost in the gain control characteristic of a gain control circuit.

BRIEF DESCRIPTION OF THE DRWAINGS

In the accompanying drawings:

FIG. 2 is a circuit diagram showing a concrete circuit structure of an example of a variable gain circuit;

DESCRIPTION OF THE PREFERRED EMBODIMENTS

Figure 1:
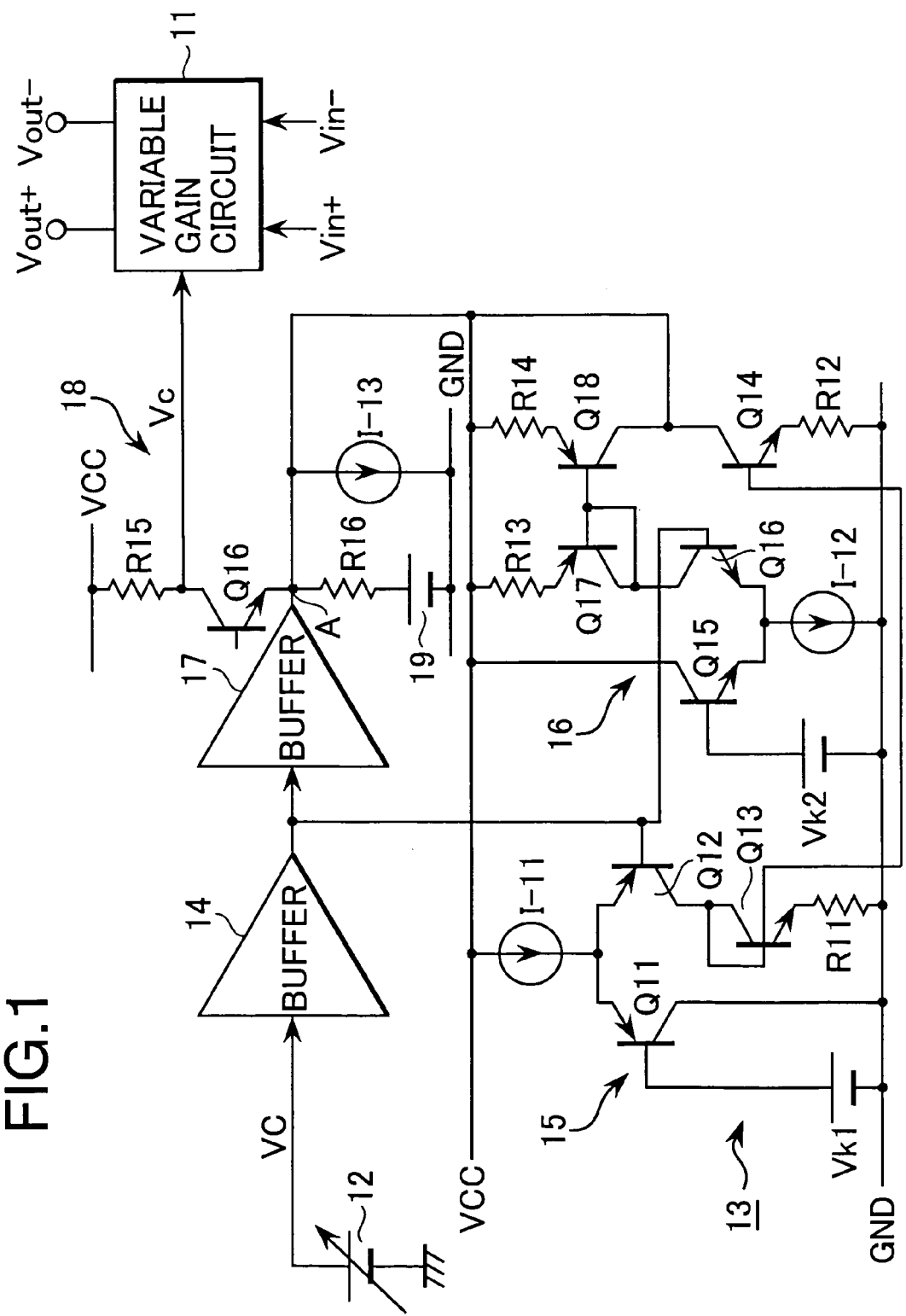
FIG. 1 is a circuit diagram showing a construction of a gain control circuit related to a first embodiment of the present invention.

Detailed descriptions of preferred embodiments of the present invention are described with reference to the accompanying drawings as follows. FIG. 1 is a circuit diagram showing a construction of a gain control circuit related to a first embodiment of the present invention.

A gain control circuit, according to the present invention, comprises a variable gain circuit 11 having a limited variable gain range and a control voltage supply circuit 13, wherein the control voltage supply circuit 13 receives an external control voltage VC from an external control voltage generating source 12 and converts this external control voltage VC into an internal control voltage Vc to be supplied to the variable gain circuit 11 as a gain control voltage.

Figure 6:
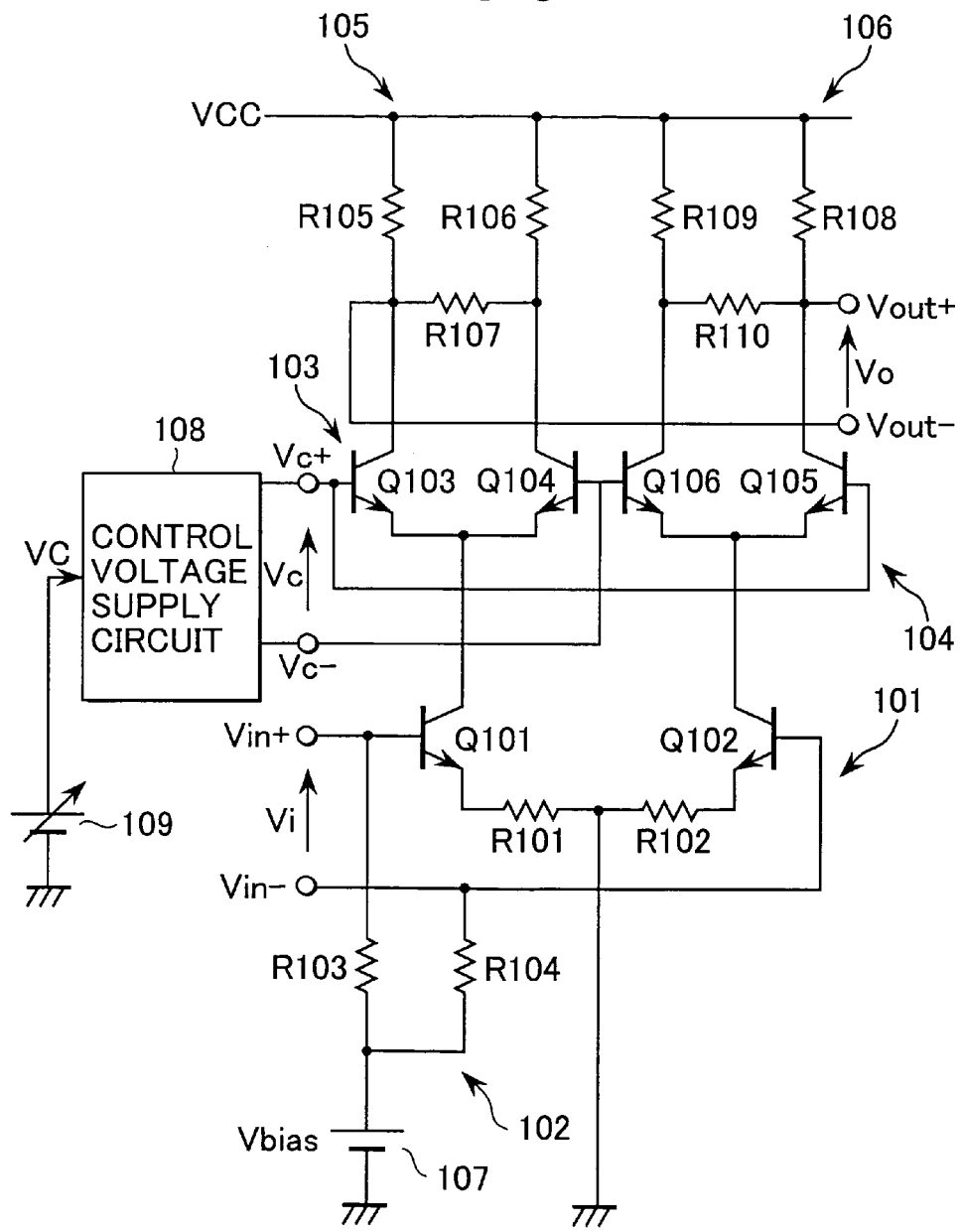
FIG. 6 is a circuit diagram showing a construction of a gain control circuit related to a conventional embodiment.
Figure 7:
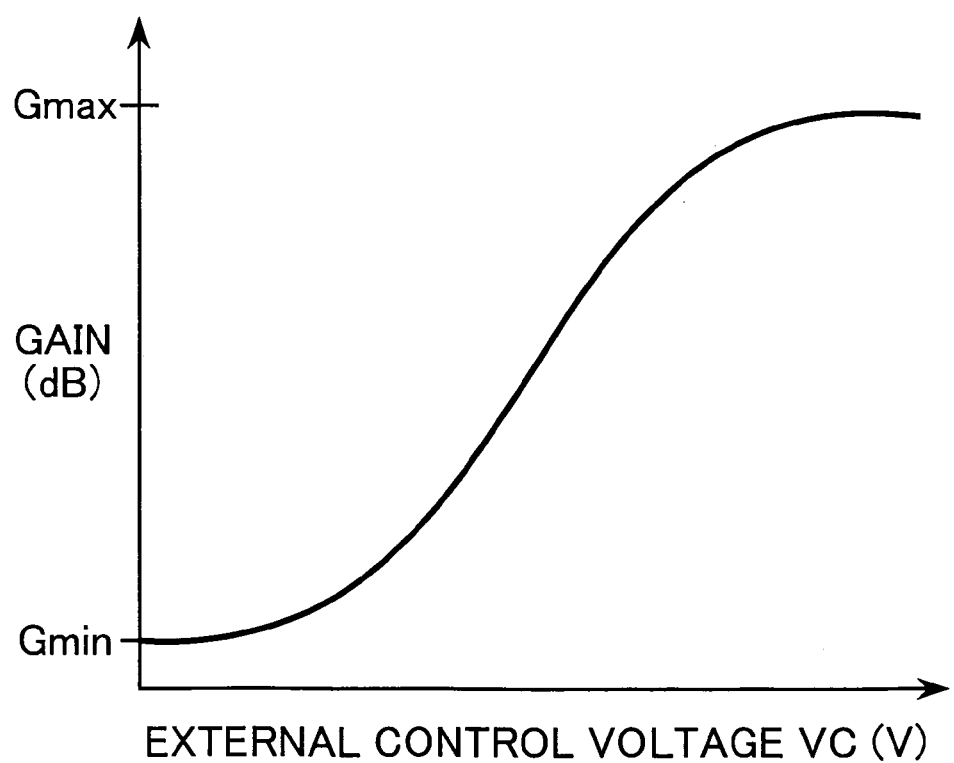
FIG. 7 is a graph chart of an external control voltage—transmission gain related to the conventional embodiment.

As the variable gain circuit 11, a circuit having the same circuit construction as the variable gain circuit related to the conventional embodiment shown in FIG. 6 is used. In other words, the variable gain circuit 11 comprises a differential amplifying circuit 21, a bias circuit 22, a pair of current dividing circuits 23 and 24 and a pair of resistive circuit meshes 25 and 26, as shown in FIG. 2.

The differential amplifying circuit 21 comprises npn-type differential pair transistors Q21 and Q22, wherein emitter electrodes of the differential pair transistors Q21 and Q22 are commonly connected to the ground by way of emitter resistors R21 and R22, and an input voltage Vi is supplied to each base electrode of the differential pair transistors Q21 and Q22 by way of a pair of input terminals Vin+ and Vin−.

The bias circuit 22 comprises bias resistors R23 and R24 connected respectively to the base electrodes of the differential pair transistors Q21 and Q22 and a bias voltage supply 27 connected between the bias resistors R23 and R24 and the ground so as to supply a bias voltage Vbias to each base electrode of the differential pair transistors Q21 and Q22 through the bias resistors R23 and R24.

The one current dividing circuit 23 comprises npn-type differential pair transistors Q23 and Q24, wherein each emitter electrode of the differential pair transistors Q23 and Q24 is connected commonly to a collector electrode of the transistor Q21. The other current dividing circuit 24 comprises npn-type differential pair transistors Q25 and Q26, wherein each emitter electrode of the differential pair transistors Q25 and Q26 is connected commonly to a collector electrode of the transistor Q22.

In these current dividing circuits 23 and 24, base electrodes of the transistors Q23 and Q25 are connected to each other and base electrodes of the transistors Q24 and Q26 are connected to each other, wherein the internal control voltage Vc is applied to these base electrodes of the transistors Q23, Q25, Q24 and Q26 by way of input terminals Vc+ and Vc−. And, an output voltage Vo is derived from collectors of the transistors Q23 and Q25 by way of a pair of output terminals Vout+ and Vout−.

The one resistive circuit mesh 25 comprises resistors R25 and R26 connected between the differential pair transistors Q23 and Q24 and a power source voltage VCC and a resistor R27 connected between the collector electrodes of the differential pair transistors Q23 and Q24. The other resistive circuit mesh 26 comprises resistors R28 and R29 connected between the differential pair transistors Q25 and Q26 and the power source voltage VCC and a resistor R30 connected between the collector electrodes of the differential pair transistors Q25 and Q26.

In the variable gain circuit 11, as constructed above, the internal control voltage Vc is supplied not only between the base electrodes of the differential pair transistors Q23 and Q24 but also between the base electrodes of the differential pair transistor Q25 and Q26, wherein the internal control voltage Vc is generated in the control voltage supply circuit 13 based on the voltage control at the external control voltage generating source 12. And the gain varies based on the change of current allocation at the current dividing circuits 23 and 24 in response to this internal control voltage Vc.

On the other hand, the control voltage supply circuit 13 generates the internal control voltage Vc in response to the external control voltage VC, wherein the internal control voltage Vc compensates a non-linearity of the gain control characteristic of the variable gain circuit 11 in a non-linear range. To be more concrete, in both ranges that are less than and greater than the linear range of the gain control characteristic in the conventional variable gain circuit, as shown in a dotted line in FIG. 3B, the control voltage supply circuit 13 generates the internal control voltage Vc shown in FIG. 3A by a solid line having more change relative to the external control voltage VC than the conventional internal control voltage beyond the linear range.

In the following, a concrete construction of the control voltage supply circuit 13 is described with reference to FIG. 1, wherein the external control voltage VC given by the external control voltage generating source 12 is supplied to a first and a second differential circuits 15 and 16 by way of a buffer circuit 14 and is further supplied to a current-voltage converting circuit 18 by way of a buffer circuit 17.

Figure 3A:
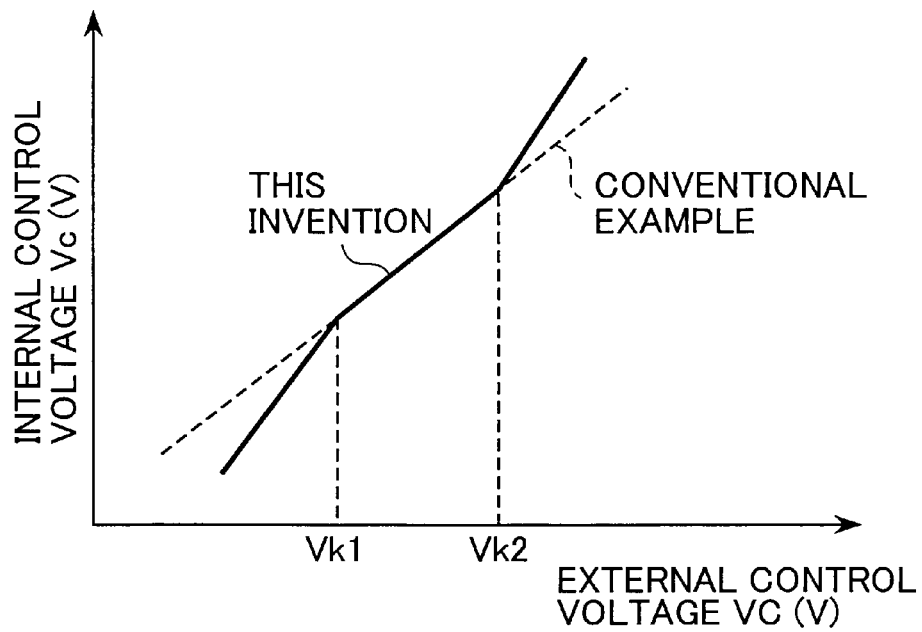
FIG. 3A is a graph chart of an internal control voltage versus an external control voltage.
Figure 3B:
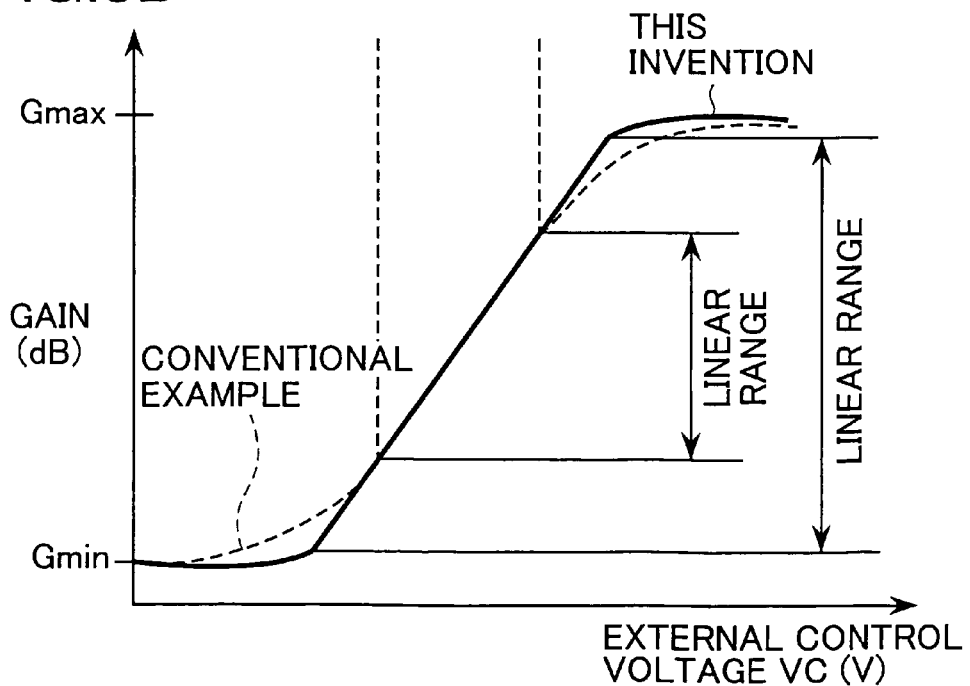
FIG. 3B is a graph chart showing a characteristic of a transmission gain versus the external control voltage.

The first differential circuit 15 comprises pnp-type differential pair transistors Q11 and Q12 respectively having emitter electrodes commonly connected to each other and a current source I-11 connected between the commonly connected emitter electrodes of the transistors Q11 and Q12 and the power source voltage VCC. And, in the first differential circuit 15, a base electrode of the transistor Q11 is supplied with a reference voltage Vk1, which corresponds to the lower limit of the linear range in the gain control characteristic of the conventional one as shown in FIGS. 3A and 3B, and a base electrode of the transistor Q12 is supplied with the external control voltage VC by way of the buffer circuit 14.

In this the first differential circuit 15, a collector electrode of the transistor Q11 is connected directly to the ground GND, and a collector electrode of the transistor Q12 also is connected to the ground GND by way of a diode-connected npn-type transistor Q13 and a resistor R11. The transistor Q13 constitutes a current mirror circuit together with an npn-type transistor Q14, wherein a base electrode of the transistor Q13 is connected to a base electrode of the transistor Q14 and an emitter electrode of the transistor Q14 is connected to the ground GND by way of a resistor R12.

The second differential circuit 16 comprises npn-type differential pair transistors Q15 and Q16 respectively having emitter electrodes commonly connected to each other and a current source 1-12 connected between the commonly connected emitter electrodes of the transistors Q15 and Q16 and the ground GND. And, in the second differential circuit 16, a base electrode of the transistor Q15 is supplied with a reference voltage Vk2, which corresponds to an upper limit of the linear range in the gain control characteristic of the conventional one as shown in FIGS. 3A and 3B, and a base electrode of the transistor Q16 is supplied with the external control voltage VC by way of the buffer circuit 14.

In this the second differential circuit 16, a collector electrode of the transistor Q15 is connected directly to the power source voltage VCC, and a collector electrode of the transistor Q16 also is connected to the power source voltage VCC by way of a diode-connected pnp-type transistor Q17 and a resistor R13. The transistor Q17 constitutes a current mirror circuit together with an pnp-type transistor Q18, wherein a base electrode of the transistor Q17 is connected to a base electrode of the transistor Q18 and an emitter electrode of the transistor Q18 is connected to the power source voltage VCC by way of a resistor R14.

On the other hand, the current-voltage converting circuit 18 comprises an npn-type transistor Q16 having an emitter electrode connected to an output (hereinafter referred to as a node A) of the buffer circuit 17, a resistor 15 interposed between a collector electrode of the transistor Q16 and the power source voltage VCC, a series-connected resistor R16 and direct-current power source 19 and a current source I-13 interposed between the node A and the ground GND. Further, each collector electrode of the transistors Q14 and Q18 of the two current mirror circuits is connected to the node A.

The circuit operation of the control voltage supply circuit 13 is described with reference to FIG. 3A and FIG. 3B. In the figures, FIG. 3A shows a graph chart of the internal control voltage Vc versus the external control voltage VC and FIG. 3B shows a graph chart showing the characteristic of the transmission gain G versus the external control voltage VC.

At first, when the external control voltage VC external control voltage generating source 12 is in the voltage range from the reference voltage Vk1 of the first differential circuit 15 to the reference voltage Vk2 of the second differential circuit 16, a current proportional to the external control voltage VC flows through the resistor R16 by way of buffer circuits 14 and 17 in the current-voltage converting circuit 18. Then a voltage at the collector electrode of the transistor Q16 generated according to this current is supplied to a variable gain circuit 11 as an internal control voltage Vc.

In other words, as shown in FIG. 3A by a solid line, a internal control voltage Vc proportional to the external control voltage VC is to be generated in the voltage range between Vk1 and Vk2 of the external control voltage VC. Accordingly, the gain of the variable gain circuit 11 is changed linearly relative to the external control voltage VC by supplying thus generated internal control voltage, Vc to the variable gain circuit 11 as the control voltage as shown in FIG. 3B by a solid line.

As shown by a dotted line in FIG. 3A, the internal control voltage Vc of a conventional circuit which varies in linearity relative to the external control voltage VC in the voltage range less than the reference voltage Vk1 and more than the reference voltage Vk2 is obtained from the current-voltage converting circuit 18 and is supplied to the variable gain circuit 11. Thereby, the gain control characteristic of the variable gain circuit 11 deteriorates in the linearity as the gain control characteristic approaches and exceeds the Gmax and the Gmin, as shown in FIG. 3B by a dotted line.

In the gain control circuit of this embodiment of the present invention, when the external control voltage VC becomes less than the reference voltage Vk1 of the first differential circuit 15, the transistor Q12 enters the ON state, then current from the current source I-11 flows to the transistor Q13 by way of the transistor Q12. As the transistor Q13 constitutes the current mirror circuit with the transistor Q14, so that if each characteristic of the transistors Q13 and Q14 is equal and if each resistive value of the resistors R11 and R12 is equal, then a current having the same value as the current flowing through the transistor Q13 flows through the transistor Q14.

At this moment, the transistor Q18 is in the off state and the collector electrode of the transistor Q14 is connected to the node A, and accordingly the current flowing into the transistor Q14 is supplied by the current-voltage converting circuit 18. Thereby in the current-voltage converting circuit 18, the change of the collector potential of the transistor Q16 becomes large relative to the external control voltage VC, because the current by the transistor Q14 flows through the transistor Q16 in addition to the current from the current source 113 and the current flowing through the resistor R16.

Therefore, in the voltage range where the external control voltage VC is less than the reference voltage Vk1, the reduction rate of the internal control voltage Vc becomes larger than the reduction rate of the internal control voltage Vc of the voltage range between Vk1 and Vk2 as the external control voltage VC goes low. And by applying the internal control voltage Vc having the large changing rate to the variable gain circuit 11, the linearity of the gain control characteristic can be extended to near the minimum transmission gain Gmin as shown in FIG. 3B.

On the other hand, the transistor Q16 enters the ON state when the external control voltage VC exceeds the reference voltage Vk2 of the second differential circuit 16. Therefore, current flows to the current source 112 through the transistors Q16 and Q17. As the transistor Q17 composes the current mirror circuit with the transistor Q18, so that if each characteristic of the transistors Q17 and Q18 is equal and each resistive value of the resistors R13 and R14 is equal, then current the same as current flowing in the transistor Q17 flows through the transistor Q18.

At this moment, the transistor Q14 is in the off state and the collector electrode of the transistor Q18 is connected to the node A, and accordingly the current flowing through the transistor Q18 is supplied to the current-voltage converting circuit 18. Thereby, in the current-voltage converting circuit 18, the change of the collector potential of the transistor Q16 becomes large relative to the external control voltage VC, because the current by the transistor Q18 flows through the transistor Q16.

Therefore, in the voltage range where the external control voltage VC exceeds the reference voltage Vk2, the increasing rate of the internal control voltage Vc becomes larger than the increasing rate of the internal control voltage Vc of the voltage range between Vk1 and Vk2 as the external control voltage VC goes lower. And, by applying the internal control voltage Vc having the large changing rate to the variable gain circuit 11, the linearity of the gain control characteristic can be extended to near the maximum transmission gain Gmax, as shown in FIG. 3B.

As described above, the control voltage supply circuit 13 generates a mid-range part of the internal control voltage Vc varying linearly against the external control voltage VC to the voltage range between Vk1 and Vk2, and a higher range part and a lower range part of the internal control voltage Vc varying in higher rate against the external control voltage VC to a voltage range outside of the voltage range between Vk1 and Vk2. And, thus generated internal control voltage Vc is supplied to the variable gain circuit 11, and accordingly the linearity can be compensated in the range where the linearity is lost in the conventional circuit-shown in FIG. 3B by the dotted line.

As a result, the linearity for the gain control characteristic of the variable gain circuit 11 is improved against the external control voltage VC, so that the usable linear range of the variable gain circuit 11 can be expanded, as shown in FIG. 3B by the solid line.

Figure 4:
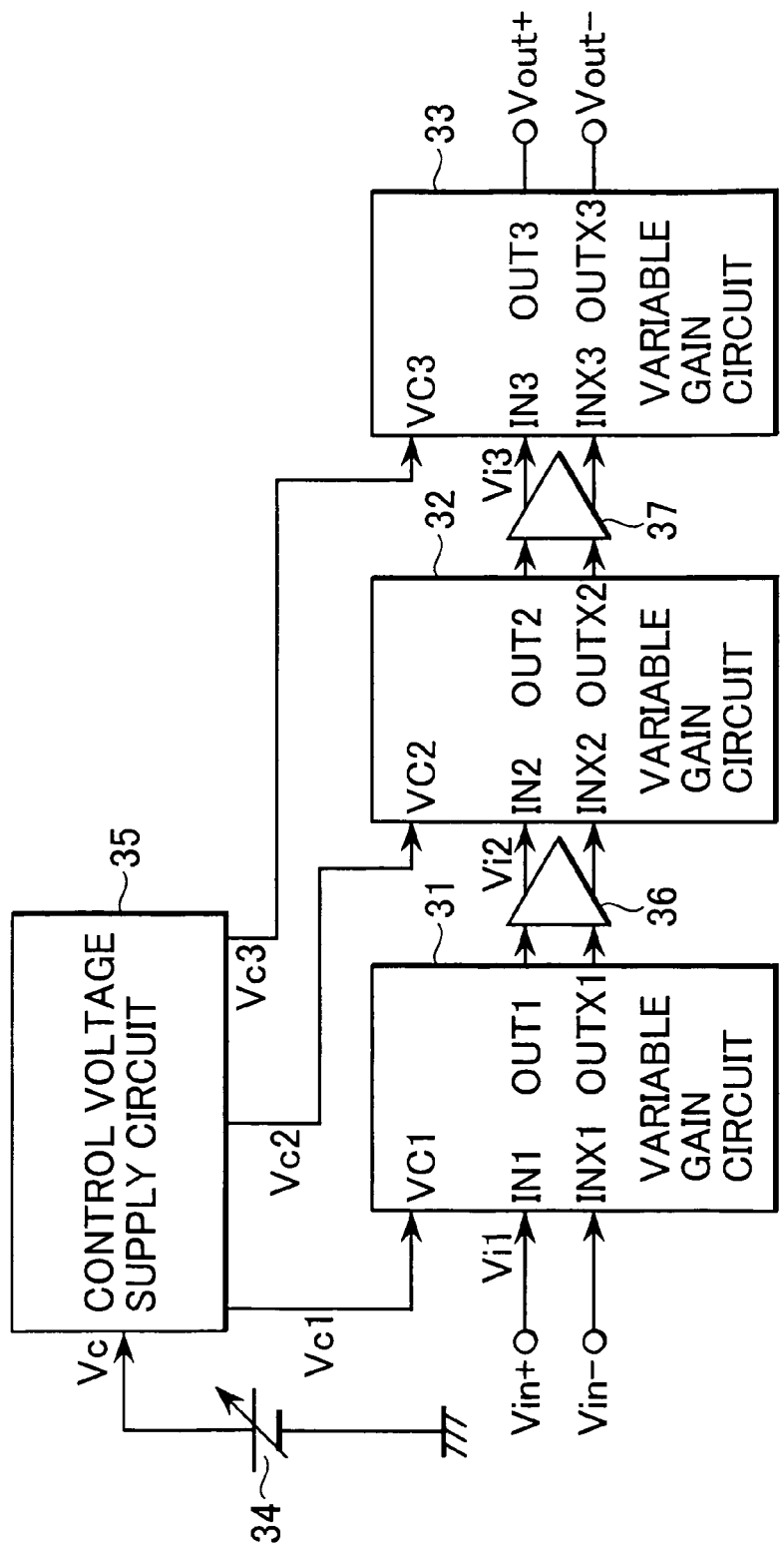
FIG. 4 is a block diagram showing a construction of a gain control circuit related to a second embodiment of the present invention.

FIG. 4 is a block diagram showing a construction of a gain control circuit related to a second embodiment of the present invention.

The gain control circuit related to the embodiment comprises a plurality of cascade-connected variable gain circuits 31, 32 and 33, each having differential input and output, and a control voltage supply circuit 35 to supply internal control voltages Vc1, Vc2 and Vc3 to the variable gain circuits 31, 32 and 33, respectively, wherein these internal control voltages Vc1, Vc2 and Vc3 are generated based on a given external control voltage VC from an external control voltage generating source 34.

Each of variable gain circuits 31, 32 and 33 has a limited variable gain range and is connected mutually by way of buffer circuits 36 and 37. These variable gain circuits 31, 32 and 33 have gain control terminals VC 1, VC 2 and VC 3, respectively, and the internal control voltages Vc1, Vc2 and Vc3 set in the control voltage supply circuit 35 are supplied to these gain control terminals VC 1, VC 2 and VC 3 as gain control voltages, as shown in FIG. 4.

In the gain control circuit of the second embodiment of the invention, the variable gain circuit shown in FIG. 2 is used as each of the variable gain circuits 31, 32 and 33. Namely the gain control circuit having the wide gain control range is composed by cascade-connecting these variable gain circuits 31, 32 and 33. In this gain control circuit, the variable gain circuit 31 handles the lower range, the variable gain circuit 32 handles the mid-range and the variable gain circuit 33 handles the upper-range on the linearity curve shown in FIG. 3B.

In addition, the circuit structure of the control voltage supply circuit 13 shown in FIG. 1 is used as the control voltage supply circuit 35. In the characteristic of the external control voltage VC against the internal control voltage Vc shown in FIG. 3A, the internal control voltages Vc1, Vc2 and Vc3 obtained from the control voltage supply circuit 35 have offset value and are supplied to each of the variable gain circuits 31, 32 and 33.

As described above, the internal control voltages Vc1, Vc2 and Vc3 obtained from the control voltage supply circuit 35 are supplied to the variable gain circuits 31, 32 and 33 as the gain control voltage which compensates the non-linearity of upper and lower ranges by the variable gain circuits 31, 32 and 33.

As thus described, in the present invention, the variable gain circuits 31, 32 and 33 are cascade-connected, the internal control voltages Vc1, Vc2 and Vc 3 are generated so as to compensate the non-linearity of a gain control circuit having relatively wide gain control range, and thus generated internal control voltage Vc1, Vc2 and Vc3 are supplied to each of the variable gain circuits 31, 32 and 33. Accordingly, each linearity characteristic of the variable gain circuits 31, 32 and 33 is improved, and thereby total linearity of the gain control circuit is largely improved as, shown in FIG. 3B by the solid line.

On the contrary, when the linear range of the gain control characteristic for the gain control circuit is not so wide as compared with the conventional linear range, only two variable gain circuits, for example the variable gain circuits 32 and 33, are necessary to expand the linear range of the gain control characteristic.

In this case, the power consumption for the AGC amplifier is reduced for the sake of this. Further if the gain control circuit comprises two variable gain circuits, one of buffer circuits 36 and 37 also is omitted and further saving of the power consumption and a reduction of circuit volume are expected.

In addition, the gain control circuit in FIG. 4 comprises three cascade-connected variable gain circuits; however, the number of the variable gain circuits is not limited to three, and it is possible to use four or more variable gain circuits in order to expand the linearity range of the gain control circuit.

Figure 5:
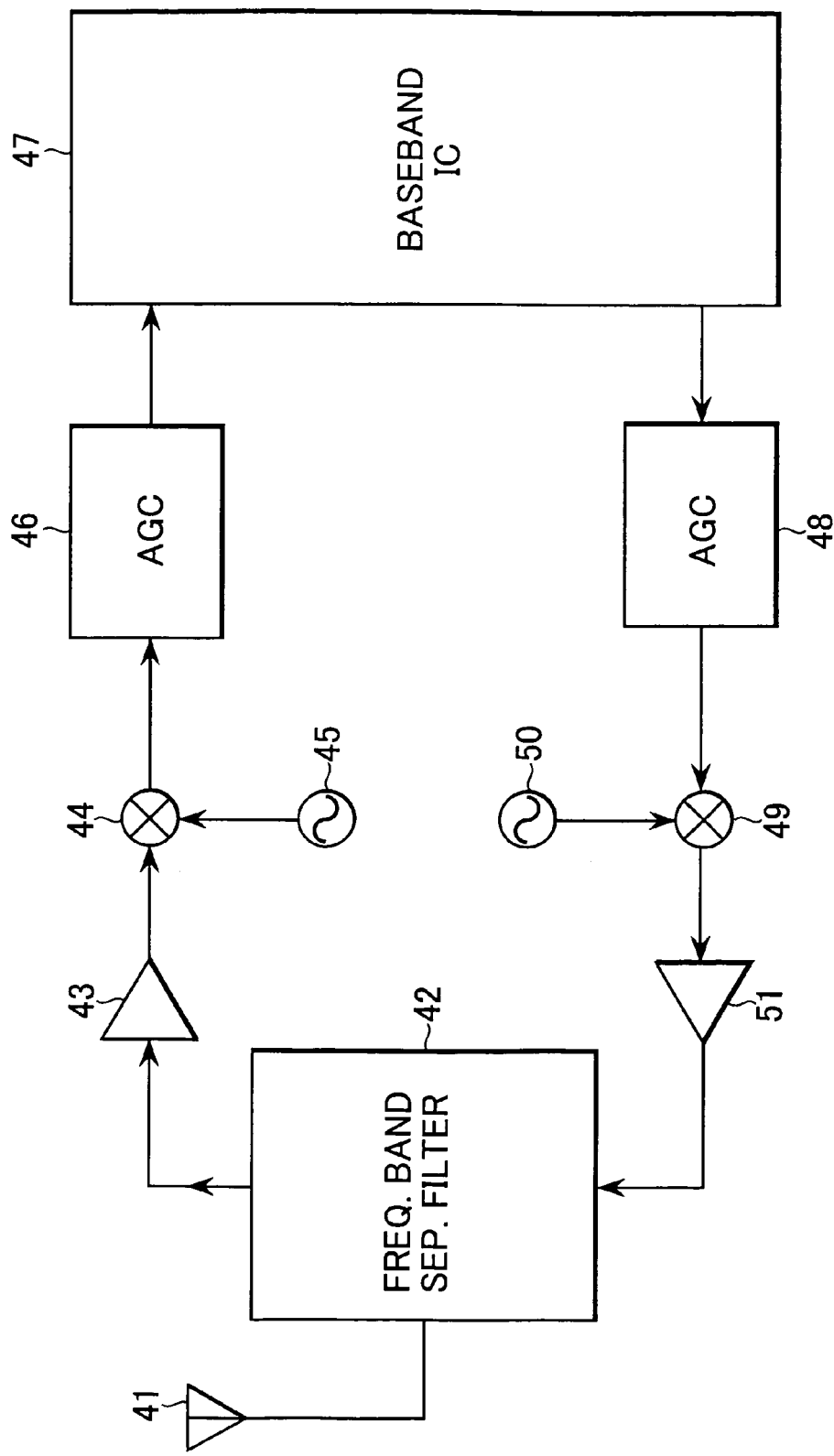
FIG. 5 is a block diagram showing an example of a construction of RF front-end part in a CDMA-type mobile telephone apparatus.

The gain control circuit of the above-described second embodiment is used, for example, as a gain control circuit for a RF front-end part in a CDMA-type mobile telephone apparatus. FIG. 5 is a block diagram showing one example of a construction of the RF front-end part in the CDMA-type mobile telephone apparatus.

A radio wave received as a receiving RF signal by a radio antenna 41 is supplied to a mixer circuit 44 by way of a frequency band separation filter 42 commonly used in transmission and reception and a low noise amplifier 43. The receiving RF signal from the low noise amplifier 43 is mixed with a local oscillation carrier from a local oscillator circuit 45 to generate a receiving IF (Intermediate Frequency) signal. Thus, the signal level of the generated IF signal is adjusted at an AGC amplifier 46, and then supplied to a base-band IC 47.

On the other hand, in transmitting, a transmitting IF signal generated in the base-band IC 47 is supplied to a mixer circuit 49 by way of an AGC amplifier 48, and the transmitting IF signal is converted to a transmitting RF signal by mixing a local oscillation carrier from a local oscillation circuit 50. This transmitting RF signal is transmitted from the antenna 41 by way of a power amplifier 51 and the frequency band separation filter 42. The base-band IC 47 functions to demodulate and decode the receiving IF signal to be an output audio signal in the receiving case and encode and modulate the input audio signal to be the transmitting IF signal in the transmitting case.

In the RF front-end part of the CDMA-type mobile telephone apparatus of the construction, the gain control circuit having a plurality of stages in the second embodiment, as mentioned above, can be applied to the AGC amplifier 48, wherein the AGC amplifier 48 is supplied with the transmitting IF signal to be supplied to the mixer circuit 49 and must have a wide gain control range.

As thus described in the transmission stage of the CDMA-type mobile telephone apparatus, a wide gain control characteristic having an extended linear range can be obtained by using the gain control circuit of the second embodiment as the AGC amplifier 48. Accordingly, only the reduced numbers of variable gain circuits are necessary in the transmission stage of the CDMA type mobile telephone apparatus and a power consumption of the mobile terminal can be achieved by applying the present invention.

In addition, the CDMA-type mobile telephone apparatus is explained as an example. However, the present invention is not limited to this application example but can be applied to various types of radio communication apparatuses.

What is claimed is:

1. A gain control circuit comprising:
  a control voltage supply circuit using an external control voltage to generate an internal control voltage; and
  a variable gain circuit having an uncompensated gain characteristic and a compensated gain characteristic, wherein:
  said control voltage supply circuit generates said internal control voltage in response to said external control voltage as to compensate for linearity of said variable gain circuit to an extent of said external control voltage where said variable gain circuit loses said linearity,
  said internal control voltage relative to said external control voltage from a first reference voltage to a second reference voltage is different from when said external control voltage is less than said first reference voltage or exceeds said second reference voltage,
  said uncompensated gain characteristic relative to said external control voltage is linear from said first reference voltage to said second reference voltage, and is non-linear when said external control voltage is less than said first reference voltage or exceeds said second reference voltage,
  said variable gain circuit uses said internal control voltage to produce a compensated gain characteristic,
  said compensated gain characteristic relative to said external control voltage being linear from said first reference voltage to said second reference voltage, and being linear when said external control voltage is less than said first reference voltage or exceeds said second reference voltage, and
  said compensated gain characteristic is a transmission gain.

2. The gain control circuit as claimed in claim 1, wherein said internal control voltage relative to said external control voltage from said first reference voltage to said second reference voltage increases less than when said external control voltage is less than said first reference voltage or exceeds said second reference voltage.

3. The gain control circuit as claimed in claim 1, wherein said variable gain circuit receives said internal control voltage as a gain control signal.

4. The gain control circuit as claimed in claim 1, wherein said transmission gain varies based upon said internal control voltage.

5. The gain control circuit as claimed in claim 1, wherein more than one said variable gain circuit is connected in cascade connection.

* * * * *